(12) United States Patent
Fredrickson et al.

(10) Patent No.: US 7,543,204 B2
(45) Date of Patent: Jun. 2, 2009

(54) METHOD, APPARATUS AND COMPUTER PROGRAM PRODUCT FOR DESIGNING LOGIC SCAN CHAINS FOR MATCHING GATED PORTIONS OF A CLOCK TREE

(75) Inventors: Mark S. Fredrickson, Rochester, MN (US); Glen Howard Handlogten, Rochester, MN (US); Steven Paul Jones, Rochester, MN (US); Chad B. McBride, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 726 days.

(21) Appl. No.: 11/191,417

(22) Filed: Jul. 28, 2005

(65) Prior Publication Data
US 2007/0168797 A1    Jul. 19, 2007

(51) Int. Cl.
*G01R 31/28* (2006.01)
(52) U.S. Cl. .................................................... 714/726
(58) Field of Classification Search ........................ None
See application file for complete search history.

(56) References Cited

U.S. PATENT DOCUMENTS

| | | | | |
|---|---|---|---|---|
| 5,280,616 | A | * | 1/1994 | Butler et al. ................. 718/108 |
| 6,002,633 | A | * | 12/1999 | Oppold et al. ......... 365/230.03 |
| 6,028,983 | A | * | 2/2000 | Jaber ........................... 714/30 |
| 6,106,568 | A | * | 8/2000 | Beausang et al. ............. 716/18 |
| 6,448,835 | B1 | * | 9/2002 | Douskey et al. ............. 327/295 |
| 6,651,197 | B1 | * | 11/2003 | Wildes et al. ................ 714/726 |
| 6,970,815 | B1 | * | 11/2005 | Bombal et al. ................ 703/15 |
| 7,231,563 | B2 | * | 6/2007 | Vinke et al. .................. 714/718 |
| 2005/0028060 | A1 | * | 2/2005 | Dervisoglu et al. ......... 714/726 |

* cited by examiner

*Primary Examiner*—Cynthia Britt
*Assistant Examiner*—Guerrier Merant
(74) *Attorney, Agent, or Firm*—Joan Pennington

(57) ABSTRACT

Methods, apparatus, and computer program product are provided for designing logic scan chains for matching gated portions of a clock tree. A clock tree includes a plurality of sections, each section including a gate receiving inputs of a global clock and a chain-specific clock control signal for a particular scan chain. A plurality of scan chains is defined, each including a plurality of latches. Each scan chain latch is connected to a corresponding chain-specific clock tree section.

14 Claims, 18 Drawing Sheets

PRIOR ART

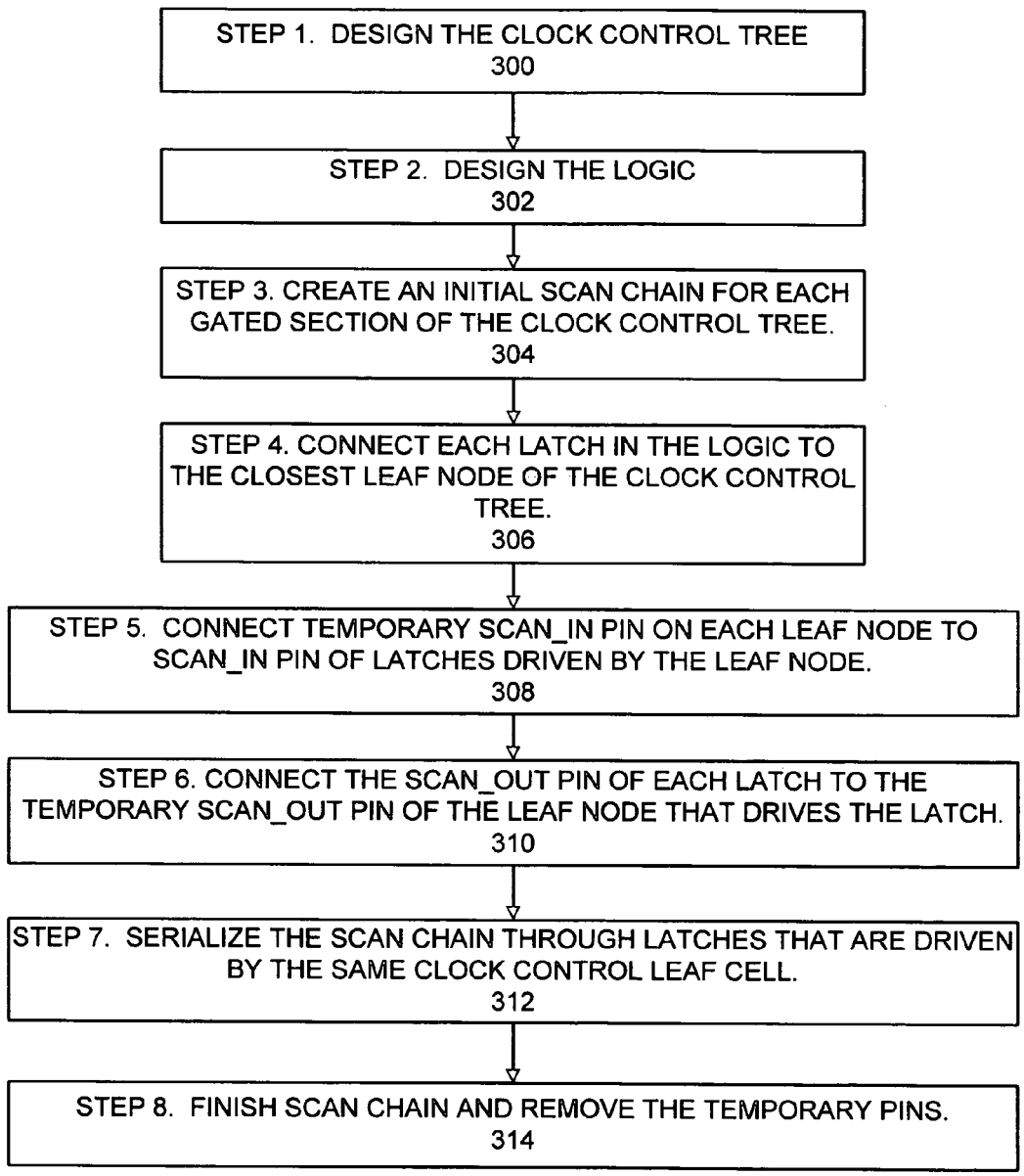

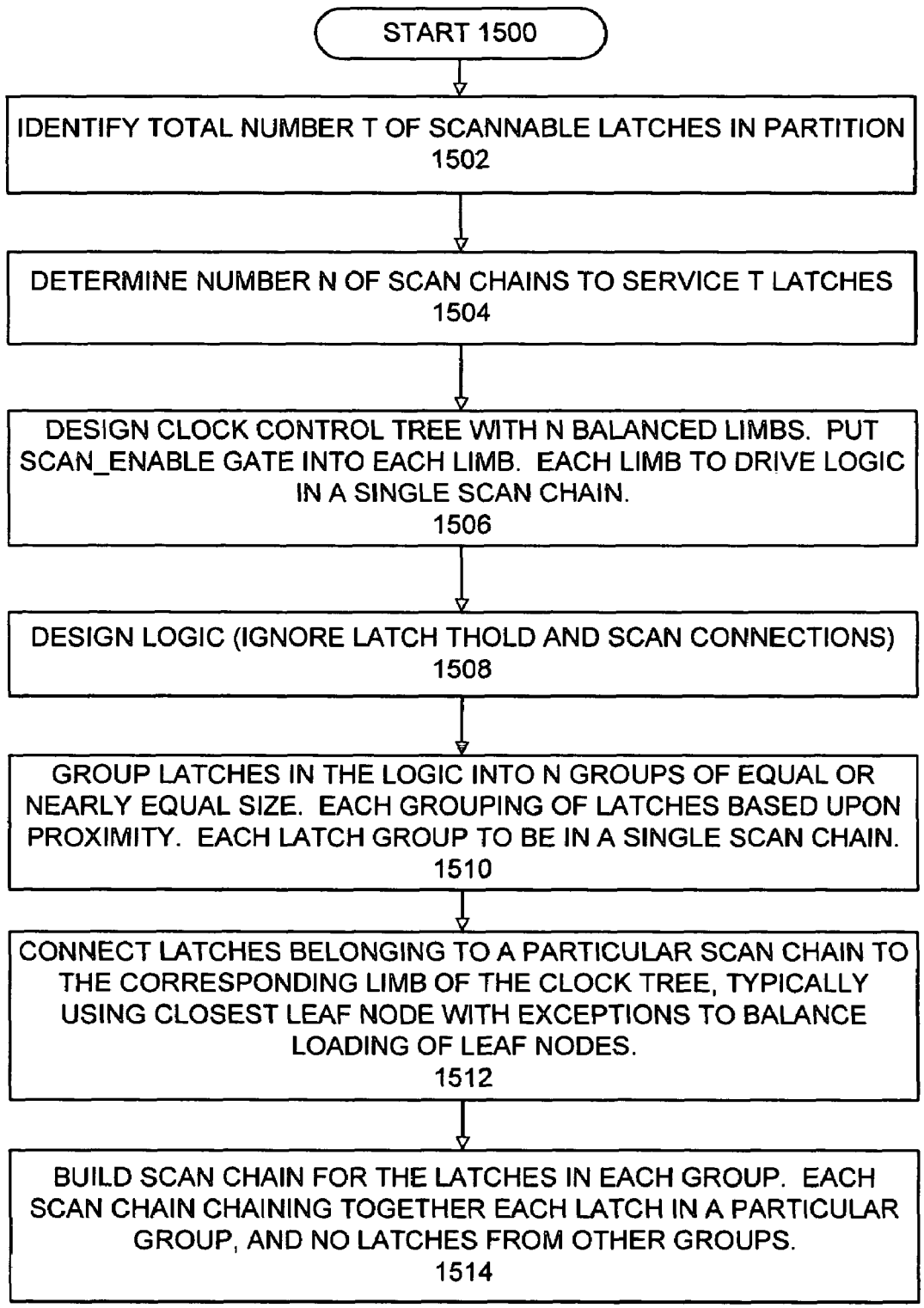

METHOD, APPARATUS AND COMPUTER PROGRAM PRODUCT FOR DESIGNING LOGIC SCAN CHAINS FOR MATCHING GATED PORTIONS OF A CLOCK TREE

FIELD OF THE INVENTION

The present invention relates generally to the data processing field, and more particularly, relates to methods, apparatus, and computer program product for designing integrated circuit logic scan chains for matching gated portions of a clock tree.

DESCRIPTION OF THE RELATED ART

In some of today's complex integrated circuits clock control signals often are used to gate the clock signals for all or part of the chip. These signals are used to turn off the clocks to the entire chip or to different parts of the chip as may be needed for a variety of reasons, such as power savings, chip configuration, thermal management, and the like. The global clock control signals can be called THOLD signals.

As used in the following description and claims, the term clock control tree means a tree or grid structure used to distribute clock control signals to all latches and storage elements and the signal distributed using the clock control tree could include a clock signal and/or a clock control signal of some type including a scan chain specific clock gate signal.

In some integrated circuit chips, different sections of the clock control tree may be gated by unique clock gate signals. These signals allow the clocks to be turned off/on for different portions of the design. A design requirement that may be imposed is that all of the storage elements that are controlled by one of these gated sections of the clock control tree must be in the same scan chain.

For example, FIG. 1A illustrates a prior art scan chain including chain-specific clock gate signals called scan_enable signals. As shown, the scan_enable (0)-(N-1) signals are used to allow certain parts of the chip to continue running while other parts of the chip are quiesced and possibly even scanned. Each latch, register, and the like in a particular scan chain must be connected to the chain-specific clock control signal for that scan chain. Currently, substantially manual, iterative processes that are both time consuming and cumbersome are required to design scan chains as shown in FIG. 1A.

FIG. 1B illustrates a prior art level sensitive scan design (LSSD) latch of FIG. 1A including a logic control block (LCB) receiving the clock and the chain-specific clock control signal for the particular scan chain and a register (REG) receiving the chain n scan_in and data in and providing chain n scan_out and data out.

FIG. 1C illustrates scan-testing operation of a prior art LSSD latch chain arrangement. The same scan_enable signals that are used to gate different portions of the clock control tree are used in a logic built in self test (LBIST) engine to enable the corresponding scan chains. This design requirement forces a dependency between gated sections of the clock control tree and the scan chains. While this arrangement allows the logic in individual scan chains to be stopped and possibly scanned independently of the other scan chains, it does cause some serious difficulties in the logic design and timing closure process.

Ideally designers could design the clock control tree and the logic scan chains independently. That is not the case for prior art chips that have this design requirement. Furthermore, as latches move around in the design, for example, to improve timing, and the like, it would be desirable to connect the latches to the closest leaf node of the clock control tree. However, in this case the leaf nodes are not all logically equivalent and the leaf node used must match the scan chain of the latch.

Because the leaf-nodes of the clock-control distribution tree are not all functionally equivalent and the clock control tree leaf-nodes are associated with specific scan chains problems result from the current approach. Serious drawbacks for this clock control method result, currently causing significant additional time and tool resource to assure proper operation including:

Latches cannot be moved freely between scan chains for scan chain balancing. To move a latch to a new scan chain, the clock control signals also have to be changed using the leaf-nodes that correspond to the new scan chain. As the chip floorplan evolves, latches are moved around in the floorplan. The clock control distribution tree may be designed to not move around. When a latch has moved in the floorplan it would be desirable to connect that latch to the closest leaf-node of clock control tree, treating the clock control tree like the clock grid itself. However, this is often not possible without also changing the scan chain for the latch, because the leaf-nodes are associated with a specific scan chain. The scan-chain balancing that is normally done late in the design cycle cannot be uncoupled from the design of the clock control distribution tree.

SUMMARY OF THE INVENTION

Principal aspects of the present invention are to provide methods, apparatus, and computer program product for designing logic scan chains for matching gated portions of a clock tree. Other important aspects of the present invention are to provide such methods, apparatus, and computer program product for designing logic scan chains for matching gated portions of a clock tree substantially without negative effect and that overcome many of the disadvantages of prior art arrangements.

In brief, methods, apparatus, and computer program product are provided for designing logic scan chains for matching gated portions of a clock tree. A clock tree includes a plurality of sections, each section including a gate receiving inputs of a global clock and a chain-specific clock control signal for a particular scan chain. A plurality of scan chains is defined, each including a plurality of latches. Each scan chain latch is connected to a corresponding chain-specific clock tree section.

In accordance with features of the invention, in a first method for designing logic scan chains for matching gated portions of the clock tree, first the clock tree and logic are designed. Then an initial scan chain is created for each gated section of the clock tree. Next each latch in the logic is connected to a selected leaf node of the clock tree, for example, the closest leaf node of the clock tree. A serial scan chain is built through the latches being driven by a particular leaf node of the clock tree and connected together to complete the scan chain.

In accordance with features of the invention, in another method for designing logic scan chains for matching gated portions of the clock tree, a total number T of scannable latches and a number N of scan chains are identified. The clock tree is designed with a plurality of N balanced sections. The logic is designed and the latches are grouped into N groups of substantially equal size, each latch group designated for a respective single scan chain. The latches for each respective single scan chain are connected to a respective corresponding balanced section of the clock tree. Then a serial scan chain is built through the latches being driven by a particular leaf node of the clock tree and connected together to complete the scan chain.

BRIEF DESCRIPTION OF THE DRAWINGS

The present invention together with the above and other objects and advantages may best be understood from the following detailed description of the preferred embodiments of the invention illustrated in the drawings, wherein:

FIG. 3 is a flow chart illustrating exemplary steps for designing logic scan chains for matching gated portions of a clock tree in accordance with a preferred embodiment;

FIG. 15 is a flow chart illustrating exemplary steps of the alternative method of FIG. 14 in accordance with the alternative embodiment.

DETAILED DESCRIPTION OF THE PREFERRED EMBODIMENTS

In accordance with features of the invention, design methods are provided whereby a scan chain is designed automatically for each unique section of the clock control tree. Designers can work on the logic, adding latches, and the like, without worrying about hooking up to the clock control or the scan chains. A computer program product is used to connect latches to the appropriate leaf node in the clock control tree and the corresponding scan chain. Latches can be moved around late in the design cycle and the same computer program product can connect the latches to the right clock control tree leaf node and scan chain.

Figure 1A:
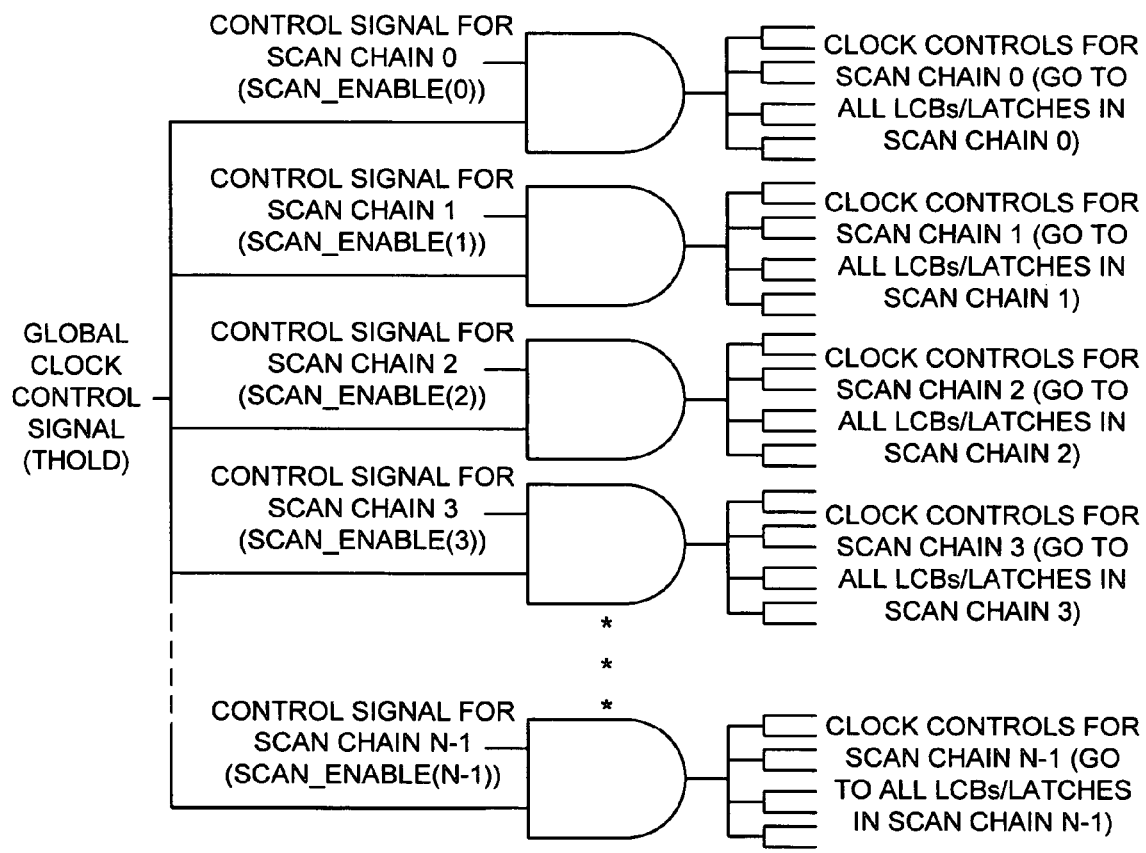
FIG. 1A is a schematic diagram of a prior art clock control tree arrangement including a chain specific clock control signal for each scan chain.
Figure 1B:
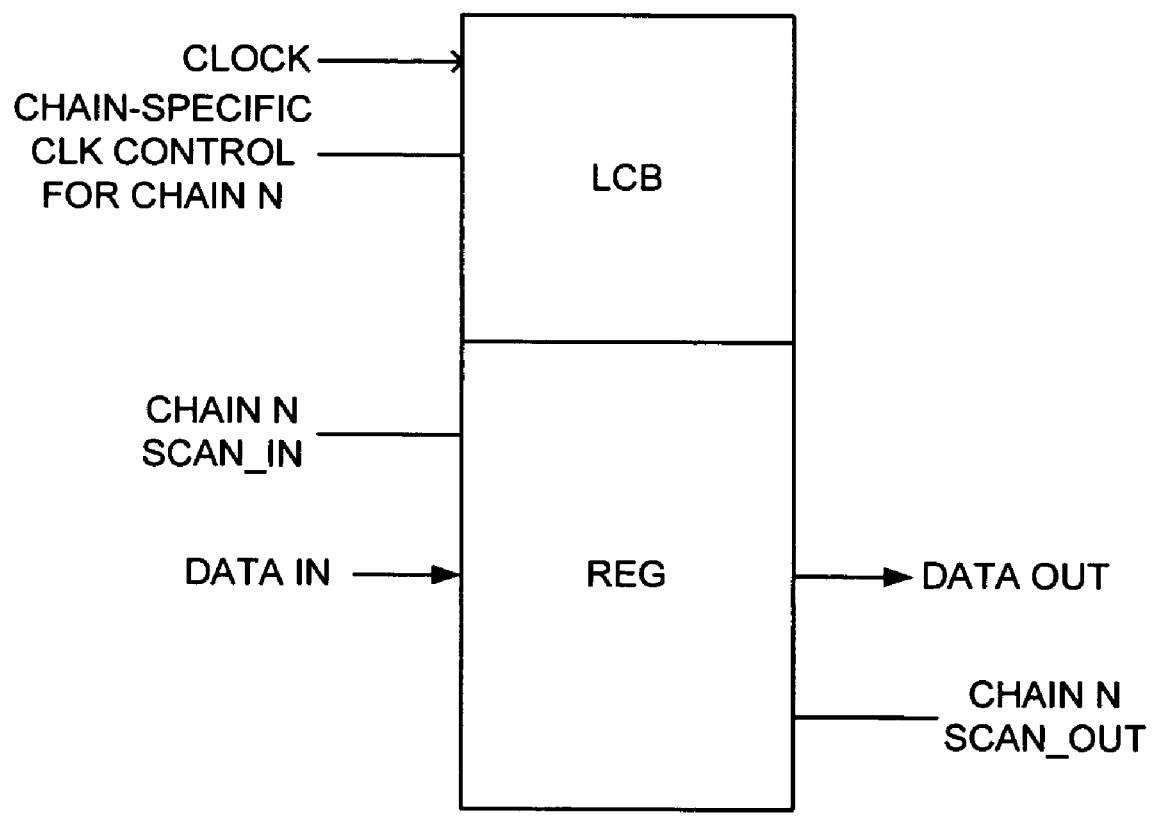
FIG. 1B is a block diagram of a prior art level sensitive scan design (LSSD) latch of FIG. 1.
Figure 1C:
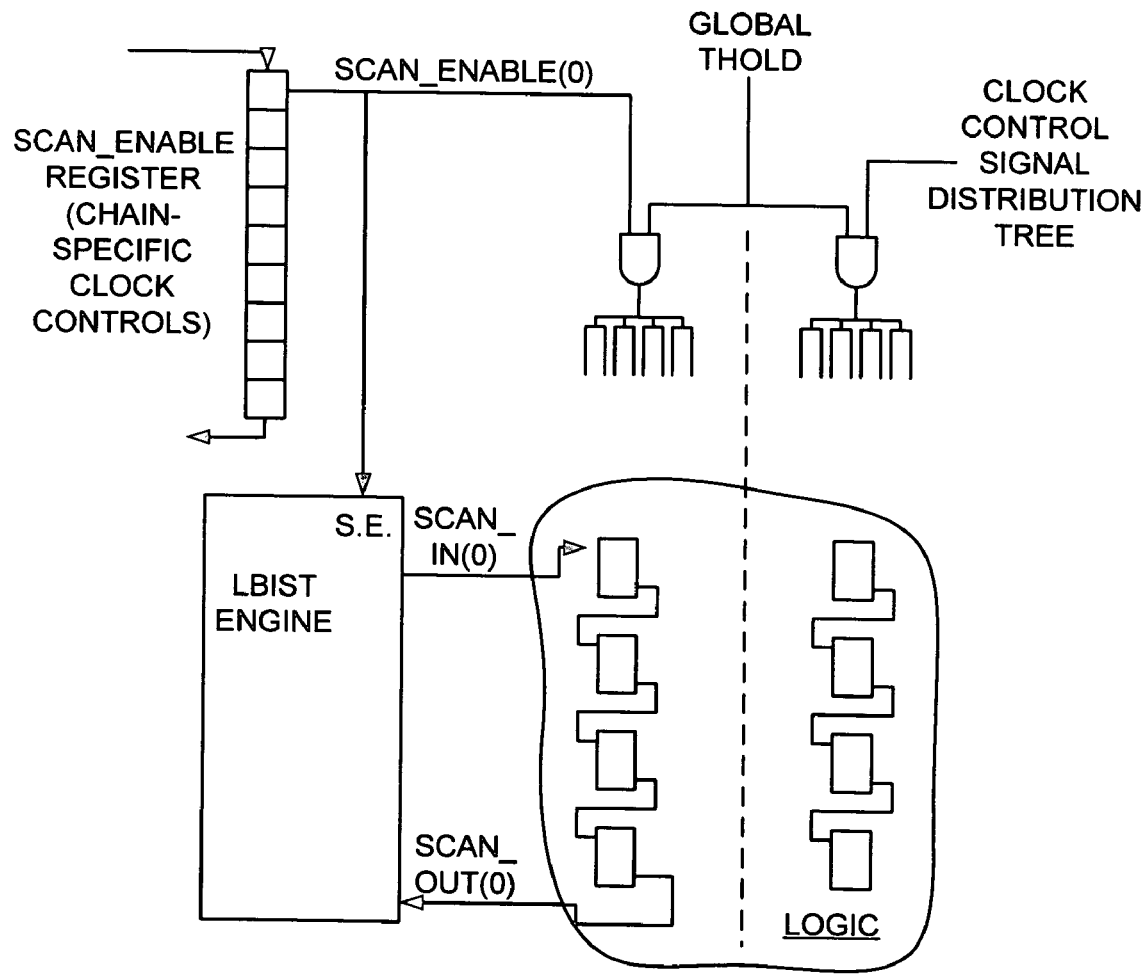
FIG. 1C is a block diagram illustrating scan testing operation of a prior art LSSD latch chain arrangement.
Figure 2A:
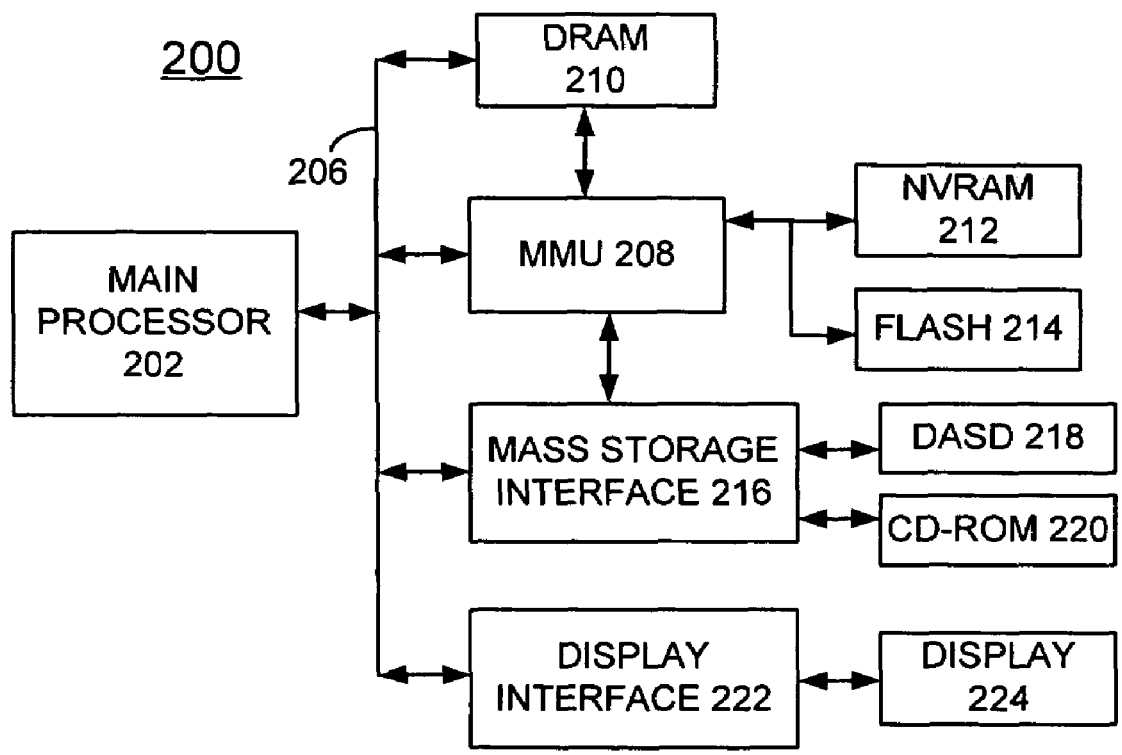
FIGS. 2A and 2B are block diagram representations illustrating a computer system and operating system for implementing methods for designing logic scan chains for matching gated portions of a clock tree in accordance with the preferred embodiments.
Figure 2B:
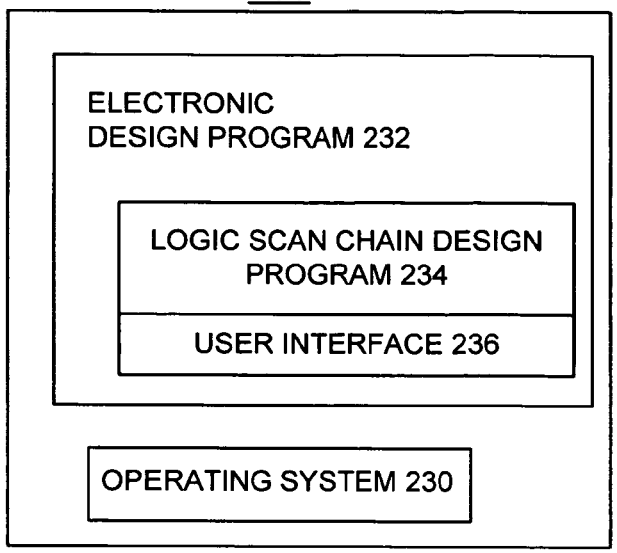

Having reference now to the drawings, in FIGS. 2A and 2B there is shown a computer system generally designated by the reference character 200 for implementing methods for designing logic scan chains for matching gated portions of a clock tree in accordance with the preferred embodiment. Computer system 200 includes a main processor 202 or central processor unit (CPU) 202 coupled by a system bus 206 to a memory management unit (MMU) 208 and system memory including a dynamic random access memory (DRAM) 210, a nonvolatile random access memory (NVRAM) 212, and a flash memory 214. A mass storage interface 216 coupled to the system bus 206 and MMU 208 connects a direct access storage device (DASD) 218 and a CD-ROM drive 220 to the main processor 202. Computer system 200 includes a display interface 222 coupled to the system bus 206 and connected to a display 224.

Computer system 200 is shown in simplified form sufficient for understanding the present invention. The illustrated computer system 200 is not intended to imply architectural or functional limitations. The present invention can be used with various hardware implementations and systems and various other internal hardware devices, for example, multiple main processors.

As shown in FIG. 2B computer system 200 includes an operating system 230, an electronic design program 232 for implementing logic designs, a logic scan chain design program 234 of the preferred embodiment, and a user interface 226.

Referring now to FIG. 3, there are shown exemplary steps performed by the logic scan chain design program 234 for designing logic scan chains for matching gated portions of a clock tree in accordance with a preferred embodiment. As indicated in a block 300, in step 1, a clock control tree is designed, for example, as illustrated and described with respect to FIG. 4. As indicated in a block 302, in step 2, the logic is designed, for example, as illustrated and described with respect to FIG. 5. In step 3, an initial scan chain for each gated section of the clock control tree is created as indicated in a block 304, for example, as illustrated and described with respect to FIG. 6. In step 4, each latch in the logic is connected to the closest leaf node of the clock control tree as indicated in a block 306, for example, as illustrated and described with respect to FIG. 7. In step 5, a temporary scan_in pin on each leaf node is connected to the scan_in pins of the latches driven by the leaf node as indicated in a block 308, for example, as illustrated and described with respect to FIG. 8. In step 6, the scan_out pin of each latch is connected to the temporary scan_out pin of the leaf node that drives the latch as indicated in a block 310, for example, as illustrated and described with respect to FIGS. 9 and 10. In step 7, the scan chain is serialized through latches that are driven by the same clock control leaf cell as indicated in a block 312, for example, as illustrated and described with respect to FIG. 11. In step 8, the scan chain is finished and the temporary pins are removed as indicated in a block 314, for example, as illustrated and described with respect to FIGS. 12 and 13.

Figure 4:
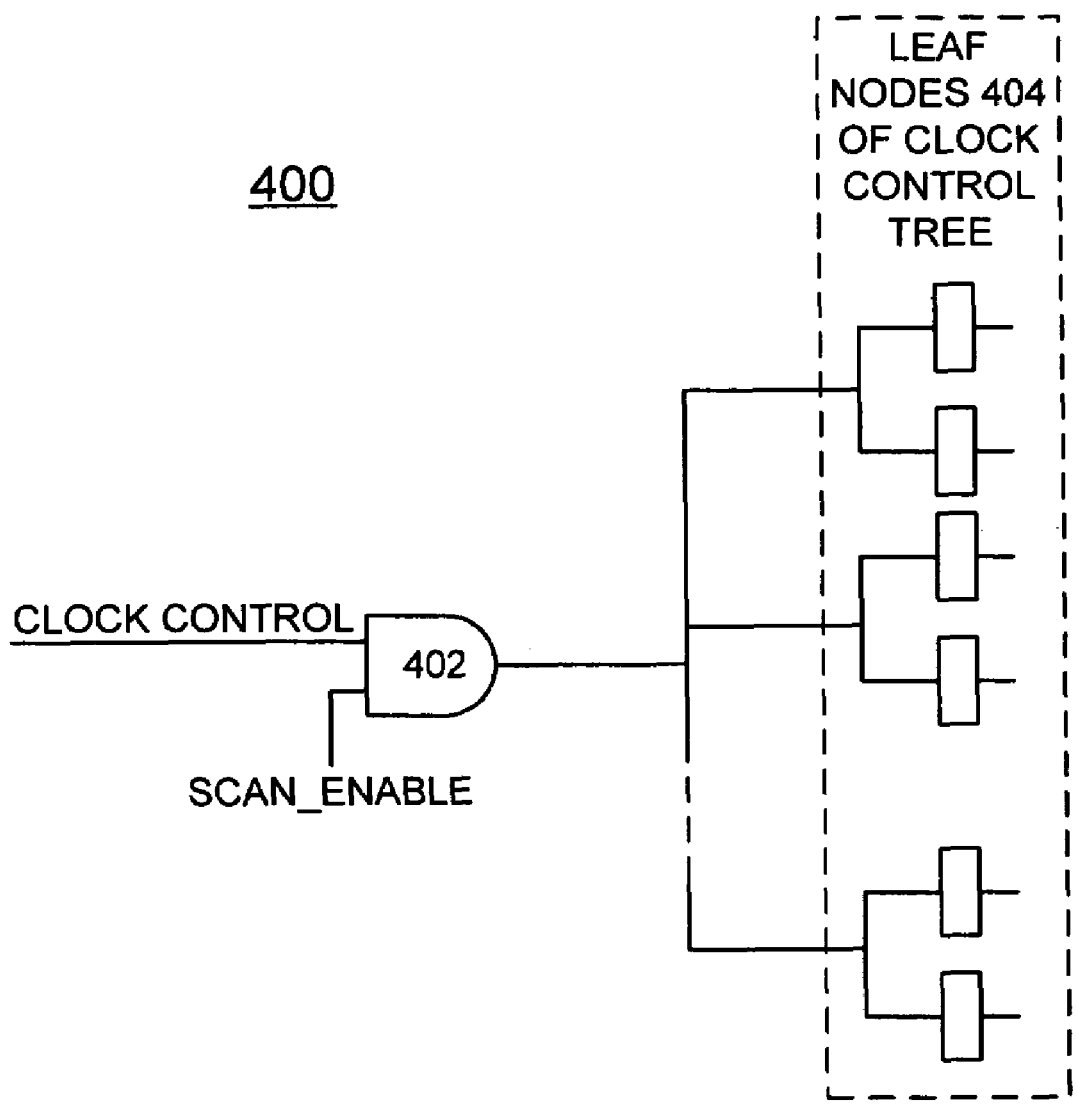
FIGS. 4-13 are block diagram representations illustrating exemplary steps of a first method for designing logic scan chains for matching gated portions of a clock tree in accordance with the preferred embodiment.

Referring now to FIG. 4, there is shown an exemplary first step of clock control tree design including an exemplary section of a clock control tree generally designated by reference character 400 of the method for designing logic scan chains for matching gated portions of a clock tree implemented in accordance with a method of the preferred embodiment. The clock control tree section 400 can propagate actual clock signals or clock gating signals such as thold. The clock control tree section 400 can be built using available clock tree construction tools. The clock control tree section 400 includes an AND gate 402 for ANDING a clock control signal and a scan_enable signal.

In accordance with features of the preferred embodiments, the clock AND gates 402 can be placed in any selected ones of a plurality of leaf nodes 404 or branches of the clock control tree section 400 for turning on/off the clocks to different sections of logic as required. This step could be done in parallel with the design of the other logic implemented in a step 2, as illustrated in FIG. 5.

Figure 5:
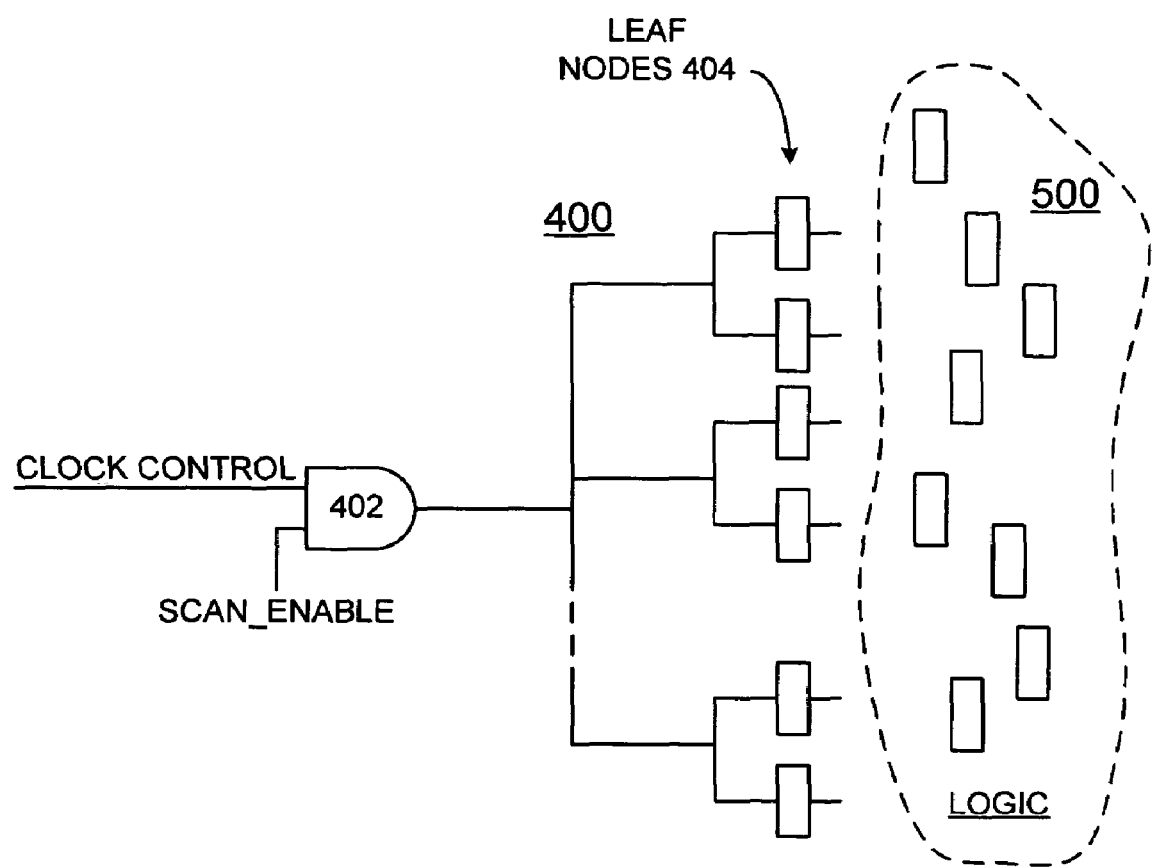

FIG. 5 illustrates the step 2 including the design of an exemplary logic generally designated by reference character 500. This logic design step 2 could be done in parallel with or even before step 1. The logic designers can design the logic assuming that the clock control tree section 400 and scan chains will be available, and will be connected later. As latches, registers, and the like are added by the circuit designers, the clk controls, scan_in, and scan_out pins can be left unconnected for now. Otherwise, the clk controls, scan_in, and scan_out pins can be manually connected in the design, as desired.

Figure 6:
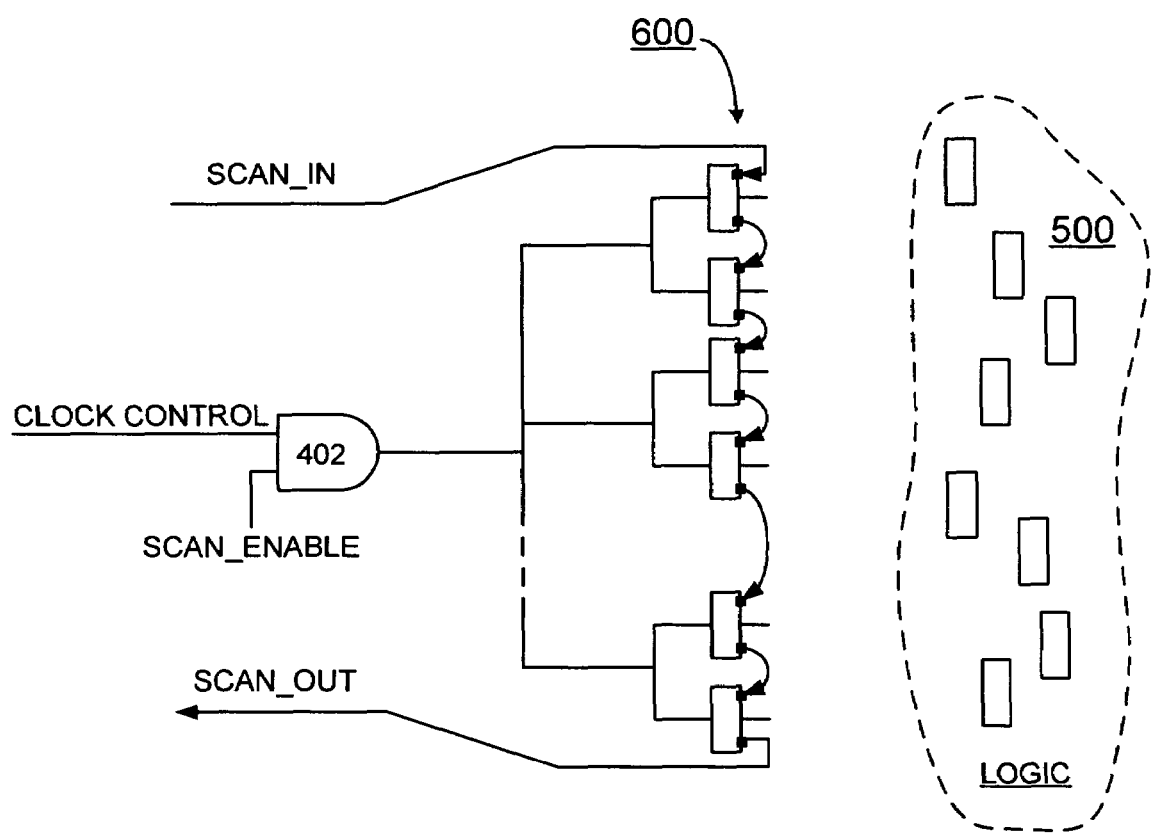

FIG. 6 illustrates a next step 3 where an initial scan chain generally designated by reference character 600 for each gated section of the clock control tree section 400. The logic 500 fed by each separately gated section of the clock control tree 400 needs to belong to a separate scan chain which corresponds to that clock control tree section. This can be done by building a scan chain 600 for each section of the clock control tree and then placing the appropriate logic latches and registers into those scan chains. Logic scan chain design program 234 advantageously is used to build these initial scan chains 600 for each section of the clock control tree.

For example, to build an initial scan chain 600 for a gated section of the clock control tree, the logic scan chain design program 234 performs the following:

(A) Trace all the paths of the clock control tree from the scan_enable gate down to all the leaf node cells controlled by that gate.

(B) Make a list of all the leaf node cells controlled by that gate.

(C) Add two temporary pins, "scan_in" and "scan_out" to each leaf node cell in the list.

(D) Connect all the leaf node cells by creating temporary nets that go from the "scan_out" pin of a leaf cell to the "scan_in" pin of the next leaf cell.

(E) Connect the scan chain input net to the "scan_in" pin of the first leaf cell in the list.

(F) Connect the scan chain output net to the "scan_out" pin of the last leaf cell in the list.

This scan chain 600 is later connected to the real logic 500 and the temporary pins are removed. It is convenient to use the temporary pins on the leaf node cells to create the scan chain because this will force the scan chain to be created in an order that will be efficient for the latches that will be connected to the chain.

Figure 7:
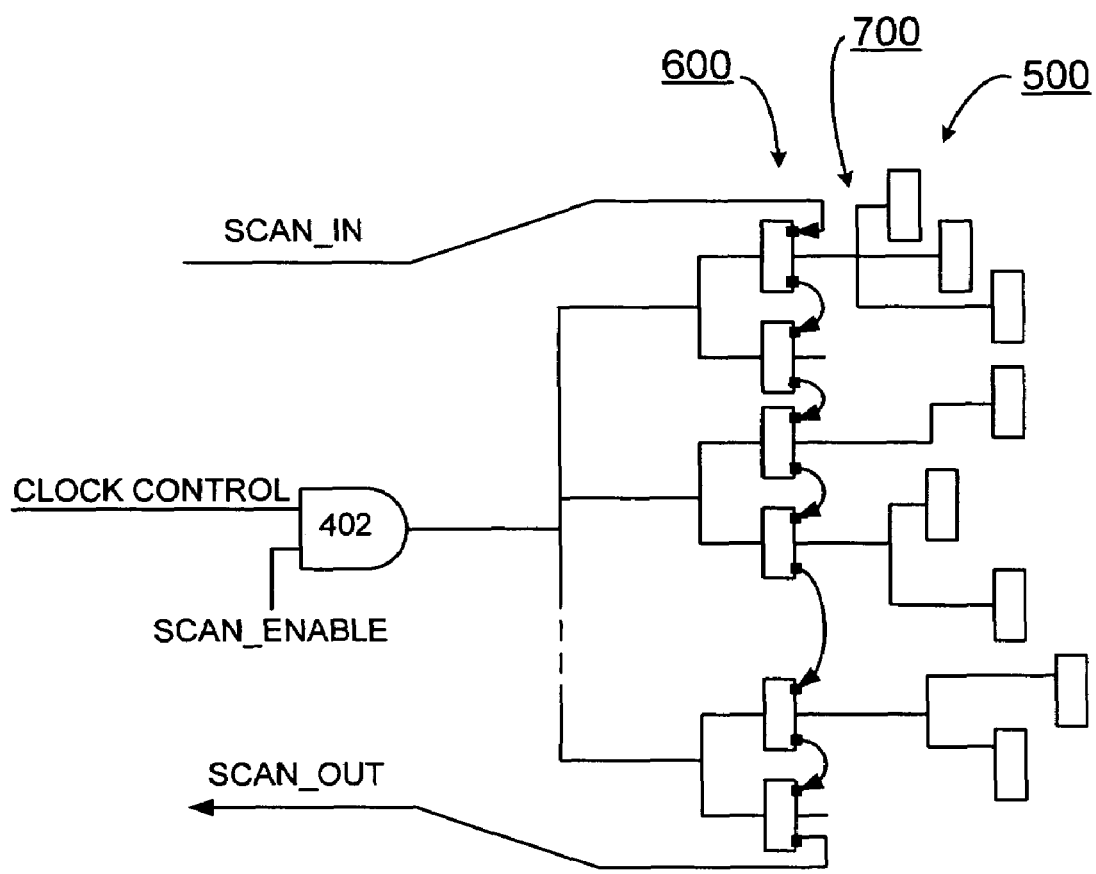

FIG. 7 illustrates a next step 4 where each latch in the logic is connected to the closest leaf node of the clock control tree as generally designated by reference character 700. In order to meet design timing constraints and to minimize wire distances, the latches and registers in the design should be connected to a leaf node 404 of the clock control tree 400 that is located near by. The logic scan chain design program 234 easily finds the closest clock control leaf node cell for each latch, and then creates a net from the leaf node cell to the appropriate pin on the latch. Sometimes it may be appropriate to connect certain latches to leaf nodes, which are near by, but are not the closest available leaf node. The designer can also connect the latches manually to the desired leaf node cells.

Figure 8:
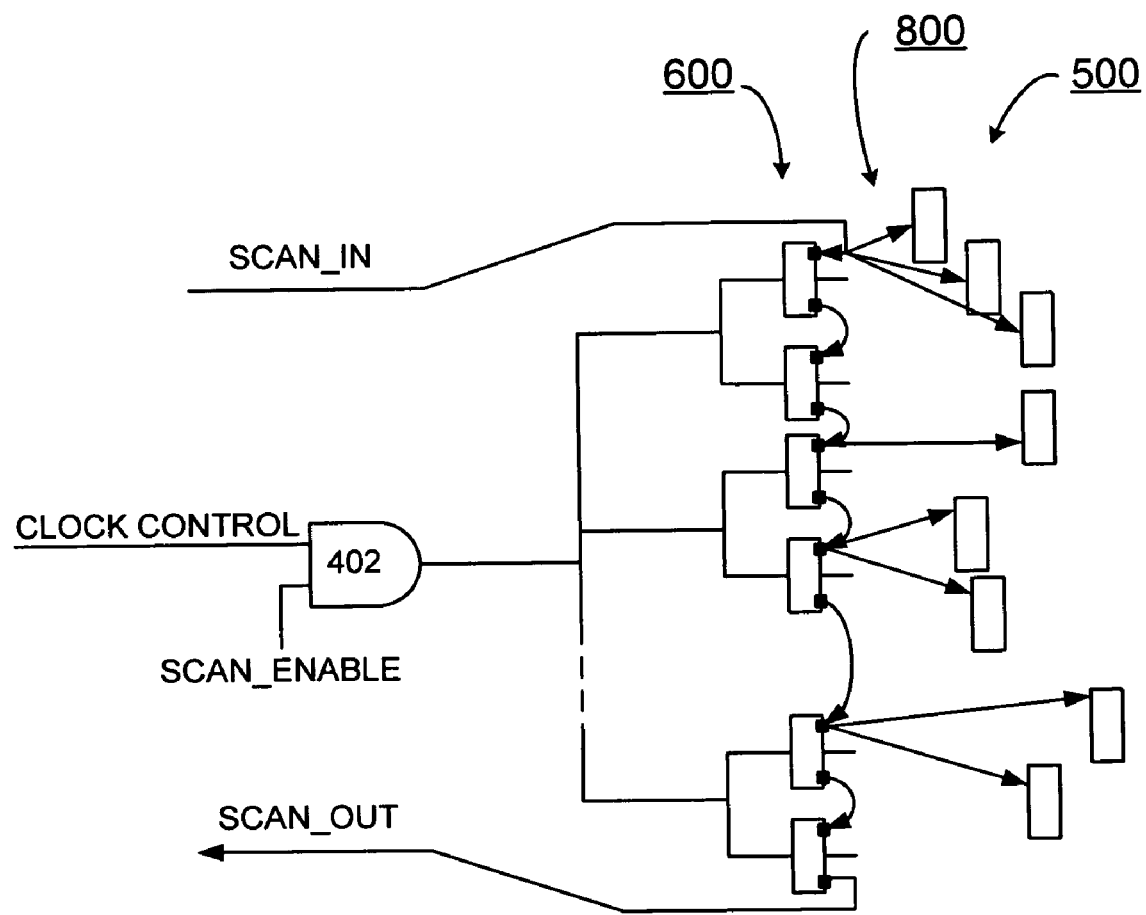

FIG. 8 illustrates a next step 5 where latches are automatically connected to the closest leaf node cell generally designated by reference character 800. In step 5, the temporary scan_in pin on each leaf node 404 is connected to the scan_in pins of the latches 500 driven by the leaf node. In step 4 illustrated in FIG. 7, a clock control tree leaf node cell was selected and connected to each latch 500. For simplicity those connections made in step 4 are not shown in the FIGS. 8 and 9. However, it is important that as the scan chains 600 are connected each latch should be built into the scan chain that goes through the same leaf cell to which the latch is connected in step 4.

To start this process of connecting the initial scan chain to the actual logic 500, the logic scan chain design program 234 can go through the list of leaf node cells for the given section of the clock control tree, and for each leaf cell the program can create a net from its scan_in pin to the scan_in pin of any latches that are driven by that cell (as defined in step 4).

Figure 9:
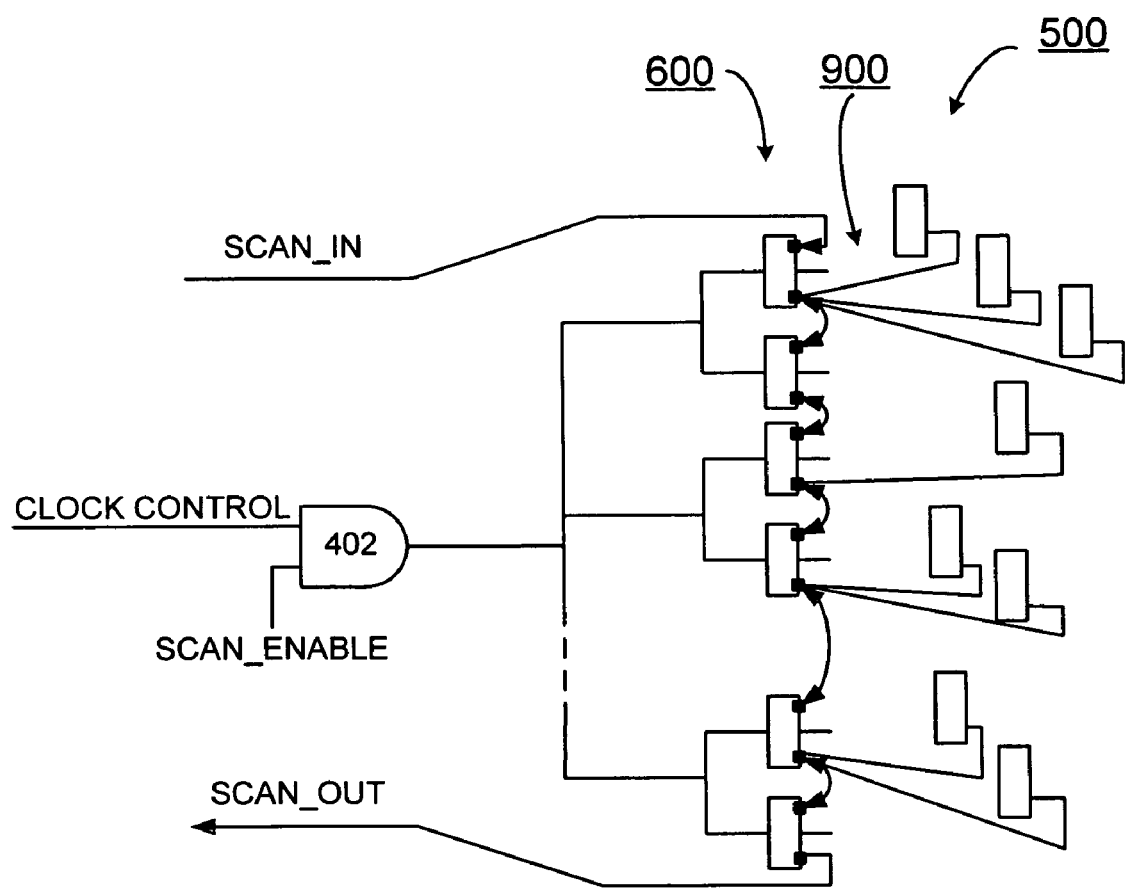

FIG. 9 illustrates a next step 6 where these scan_in connections being made in parallel to the driven latches generally designated by reference character 900. In step 6, the scan_out pin of each latch is connected to the temporary scan_out pin of the leaf node that drives the latch. The logic scan chain design program 234 could do this by going through the list of leaf node cells for the given section of the clock control tree and for each leaf cell the program could trace the clock control connection to find all latches driven by the leaf cell, as defined in step 4, and create a net from the scan_out pin of each such latch back to the temporary scan_out pin in the leaf cell. FIG. 9 shows these scan_out connections from the latches back to the leaf cells.

Figure 10:
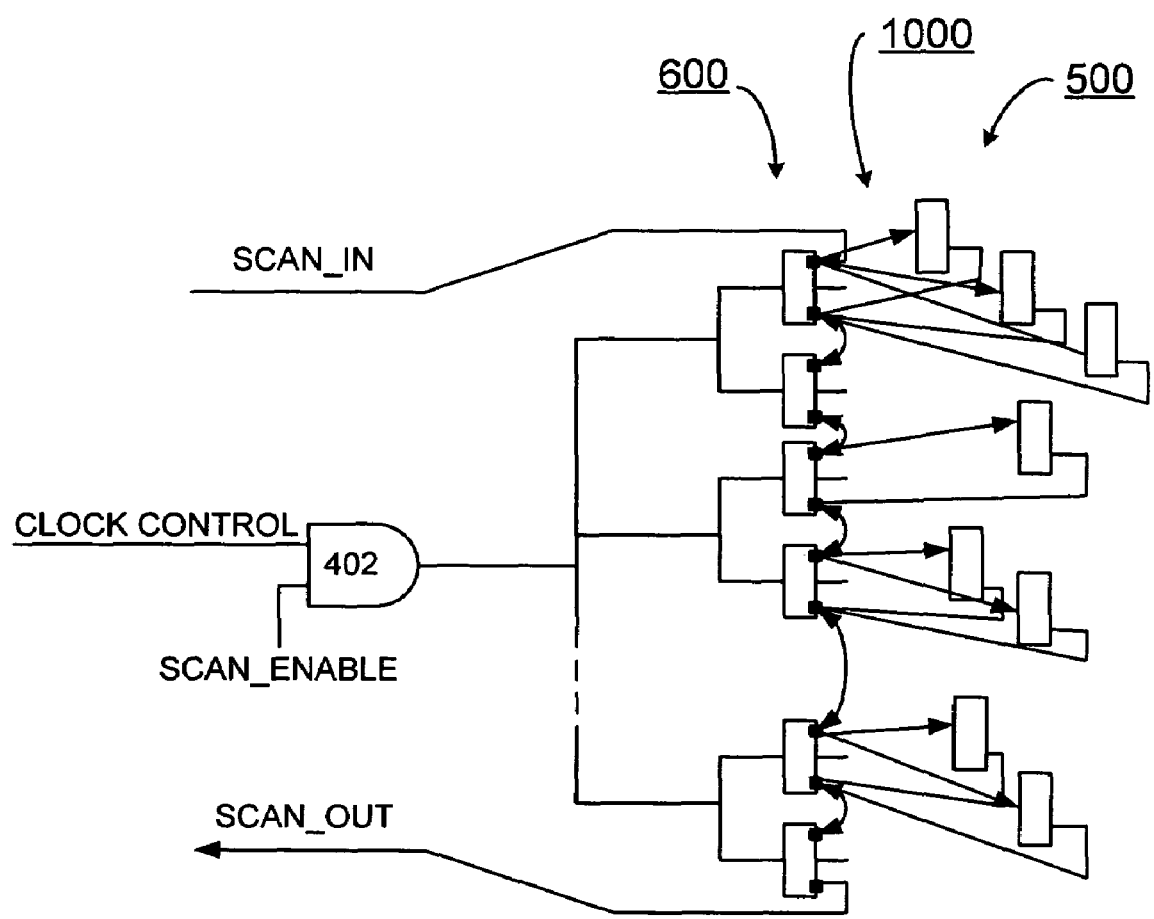

FIG. 10 shows both the scan_in and scan_out connections between the latches and the clock tree leaf cells generally designated by reference character 1000.

Figure 11:
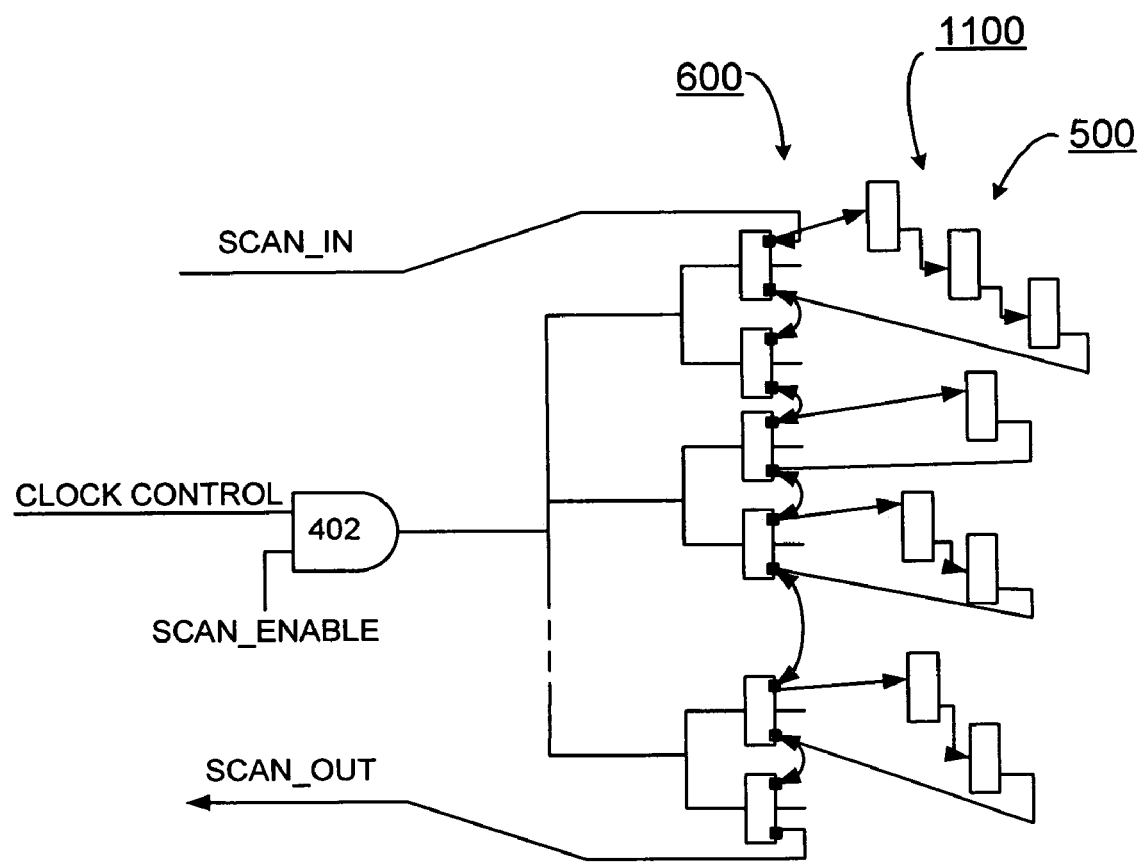

FIG. 11 illustrates a next step 7 where the scan chain is serialized through latches that are driven by the same clock control leaf cell generally designated by reference character 1100. For proper operation the scan chain must be serialized. The logic scan chain design program 234 could do this by going through the list of leaf node cells for the given section of the clock control tree, and for each leaf cell check to see if there are multiple latches connected to the cell. If there are multiple latches connected to the cell logic scan chain design program 234 could serialize the scan chain through those latches by:

(A) Choosing a scan order for the latches;

(B) Disconnecting the scan_out of the first latch from the clock control leaf node;

(C) Disconnecting the scan_in of the second latch from the clock control leaf node;

(D) Connecting the scan_out of the first latch to the scan_in of the second latch; and (E) Continue this process until the scan chain goes through all the latches in a serial fashion.

As shown in FIG. 11, the scan chain is serialized for each leaf node of the clock control tree.

Figure 12:
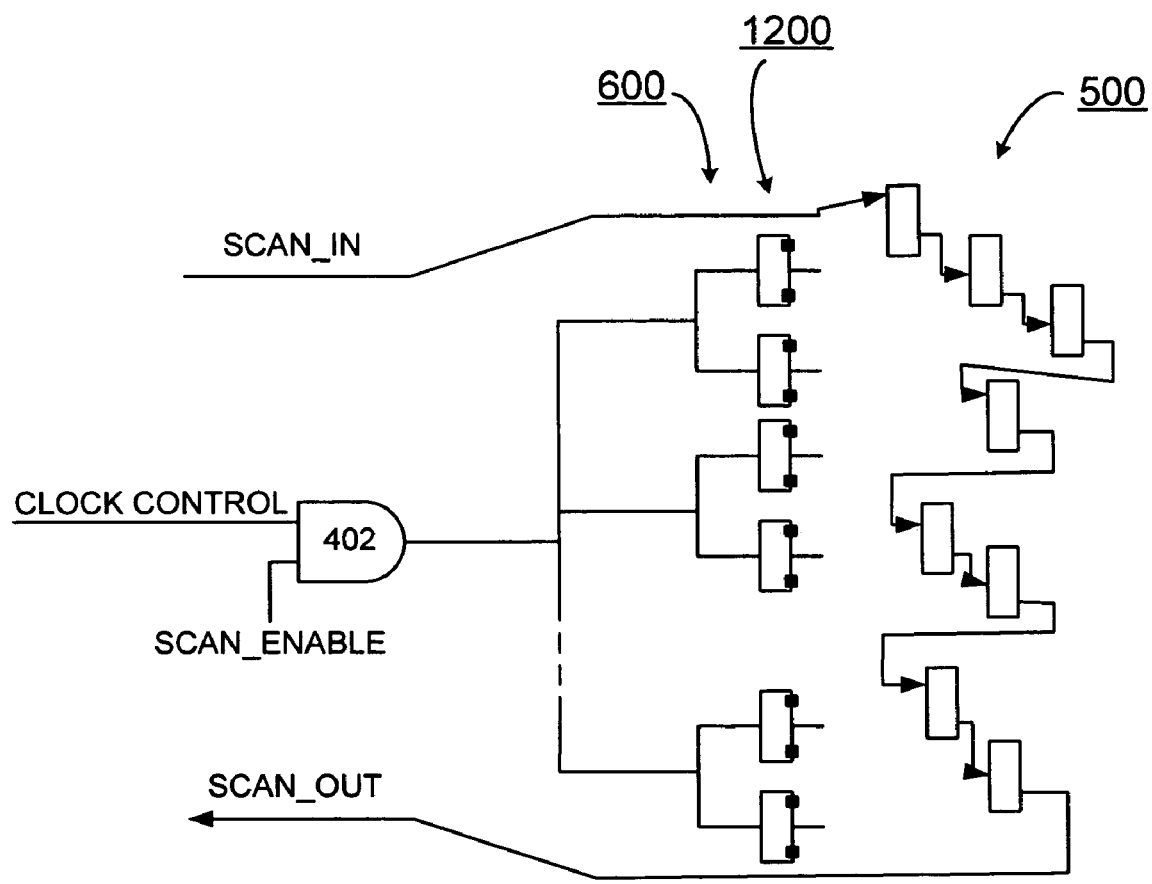

FIG. 12 illustrates a next step 8 to finish the scan chain and remove the temporary pin connections generally designated by reference character 1200. After step 7, most of the temporary scan pins on the leaf node cells should be connected to two nets, one incoming net and one outgoing net. The two nets can be disconnected from the temporary pins and the nets can be connected, joined into a single net.

Leaf cells that do not drive any latches will have only one net connected to each temporary pin: an incoming net coming into the scan_in pin and a net leaving from the scan_out pin. These two nets, even though they are connected to different temporary pins can also be disconnected from the pins and can be connected, joined into a single net. Now logic scan chain design program 234 can remove the temporary pins from all the clock tree leaf cells.

Figure 13:
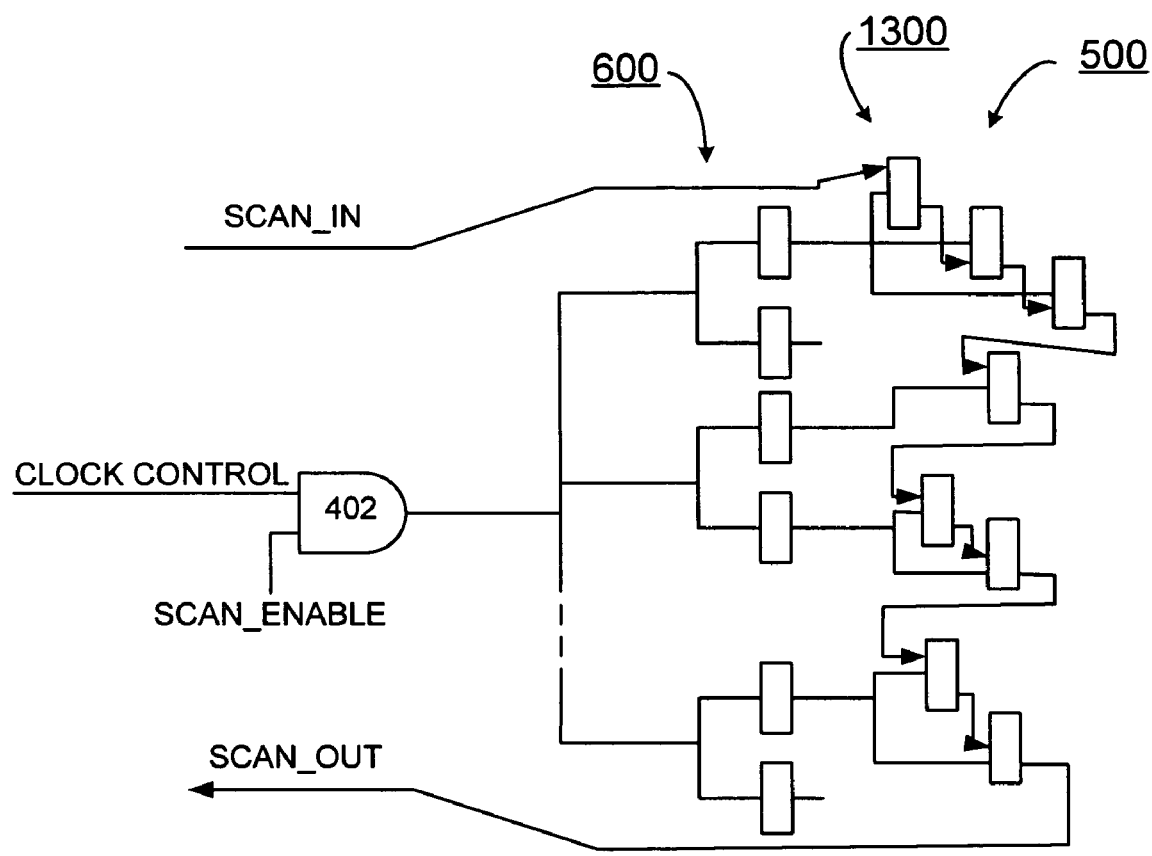

FIG. 13 shows an exemplary completed scan chain generally designated by reference character 1300 in accordance with the preferred embodiments.

It should be understood that the present invention is not limited to the illustrated method for designing a scan chain for logic that is driven by a given section of a clock control tree as described with respect to FIGS. 4-13. It should be understood that the exemplary steps of the method can be arranged in other ways and still produce the desired scan chain. For example, it may be possible to skip steps 5 and 6 as illustrated and described with respect to FIGS. 8 and 9, and directly build a serial scan chain through all of the latches which are driven by a particular leaf node cell of the clock control tree, that is to go directly from step 4 shown in FIG. 7 to step 7 as shown in FIG. 10. It should be understood that other arrangements of sequential steps would also work.

In accordance with features of the preferred embodiments as illustrated in FIGS. 4-13, the location of the clock control leaf cells advantageously is used to guide the generation of the scan chain because when the leaf cells are selected in an order that corresponds to a logical progression in physical location, then the resulting scan chain will also have an efficient physical arrangement, improving the wiring and performance of those nets. Finding the leaf cells using a depth-first search also helps contribute to finding those cells in an order, which has a logical physical progression.

Even though it is desirable to use the clock control tree leaf cells to guide the creation of the scan chain for the reason just mentioned, it should be understood that it is possible to implement the design method without actually adding temporary pins to the leaf cells. One approach would be to add temporary cells to the design instead of adding temporary pins to the leaf cells. Another approach would be to add all the temporary pins to a single temporary cell. Or, since the temporary pins are removed at the end of the process anyway, the connections facilitated by those pins could be done in program memory without ever actually adding the pins to the design.

If temporary pins are added to clock control tree leaf node cells, there could be new cells added to the cell library to accommodate this. The new cells would be copies of the existing leaf node cells with the addition of the temporary scan_in and scan_out pins. The addition of these cells would allow the design model to work properly in other design and verification tools. The program could make sure that all instances of these new cells are switched back to the original cell types when the scan chain generation process is finished.

In accordance with features of the preferred embodiments as illustrated in FIGS. 4-13, the method can be run to update and correct the scan chains whenever the logic has changed. For example, if latches have been physically moved around in the logic it may be desirable to connect them to different leaf nodes of the clock control tree and to different scan chains or different positions in the scan chains. This could be done automatically by adding Step 2.5 to the program, which step would go through the logic and remove existing scan and clock control nets from the latches before starting at step 3 to re-create or update the scan chains.

Steps for first time through: 1-2-3-4-5-6-7-8

Steps to re-do scan chains when logic has changed: 2.5-3-4-5-6-7-8

Similarly, this method could be re-used whenever the clock control tree is changed.

In accordance with features of the preferred embodiments as illustrated in FIGS. 4-13, after using this method, the logic design, including the new scan chains, could be processed through other design and verification tools as if the scan chains had been designed in the usual way. Such verification tools could include programs which would verify that the logic included in each particular scan chain is driven by the corresponding section of the clock control tree.

In accordance with features of the preferred embodiments, logic designers are allowed to add attributes and/or manual controls to a certain latches or groups of latches so that those latches would be driven by a specific section of the clock control tree and be included in the corresponding scan chain. These attributes or controls may be specific to this tool solution or some other standard attribute recognized by the tool.

Control inputs to the tool should allow the user maximum flexibility to use attributes on the cells and other graphical input to define which sections of the design might be assigned to a particular scan chain. For example, scan_in(0) might go to upper left of the chip. The logic scan chain design program 234 also allows designers to manually connect the clock control signals and scan chains if desired, overriding anything that the program would have done.

In accordance with features of the preferred embodiments, scan chain balancing is used to balance the length of scan chains to minimize test time. The logic scan chain design program 234 also provides for scan chain balancing when the clock control tree is designed so that each specific section of the tree drives approximately the right number of latches. The number and placement of the scan_enable gates 402 in the tree affect the number and size of the unique sections of the tree. Also, multiple sections of the tree can be gated by the same scan_enable signal as long as the scan chains for those sections are joined together. So scan chain balancing can also be affected by controlling the scan_enable signals that are used for tree gating and then joining together the scan chains of sections, which are gated by the same scan_enable signal. Scan chain balancing can also be controlled by using the attributes or controls to force latches to be driven by a particular section of the clock control tree and thus be included in the corresponding scan chain.

Figure 14:
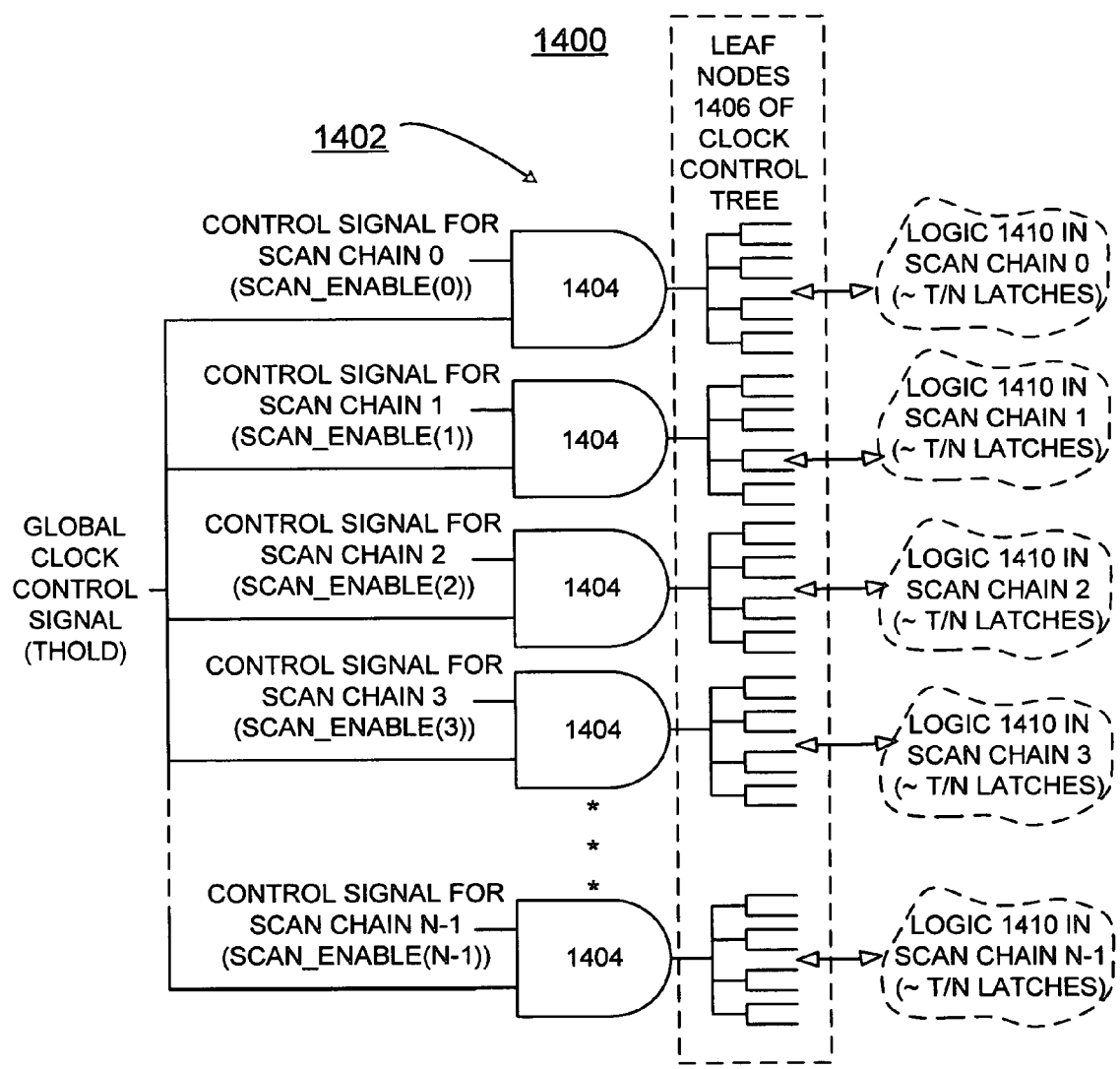
FIG. 14 is a block diagram representation illustrating an alternative method for designing logic scan chains for matching gated portions of a clock tree in accordance with an alternative embodiment.

Referring now to FIGS. 14 and 15, another method is provided for designing logic that is required to have unique clock controls for each logic scan chain. The illustrated method of FIGS. 14 and 15 and the illustrated methods of FIGS. 4-13 advantageously are used for implementing any electronic design requiring unique clock controls for each logic scan chain.

FIG. 14 illustrates an alternative arrangement for implementing an alternative method for designing logic scan chains for matching gated portions of a clock tree generally indicated by a reference character 1400 in accordance with an alternative embodiment. Clock tree 1400 includes a plurality of clock tree sections 1402, each clock tree section 1402 including an AND gate 1404 receiving the global clock control signal THOLD and a respective one of scan_enable (0)-(N−1) signals for respective scan chains (0)-(N−1). Each clock tree section 1402 includes a plurality of leaf nodes 1406. Each clock tree section 1402 is respectively coupled to logic 1410 of a respective scan chains (0)-(N−1).

In accordance with features of the alternative embodiment of FIGS. 14 and 15, logic 1410 defining the respective scan chains (0)-(N−1) is arranged with a substantially equal number of latches T/N being grouped into groups. Each group has latches T/N defining its own respective scan chain of the scan chains (0)-(N−1) and is driven by its own section 1402 of the thold clock tree 1400. The latches are grouped into scan chains before being connected to the respective section 1402 of the clock tree 1400 and each scan group must be connected to its respective section 1402. The latches defining the respective scan chains (0)-(N−1) are connected to particular leaf nodes 1406 of the respective corresponding clock tree section 1402.

Referring now to FIG. 15, there are shown exemplary steps of the alternative method starting at a block 1500. As indicated in a block 1502, first a good estimate of the total number of scannable latches that will be including in a partition of a design is identified and the total number is referred to as T.

Next, the number of scan chains is determined that will be needed to service T latches as indicated in a block 1504. This number of scan chains is referred to as N. As indicated in a block 1506, a clock control tree with N balanced limbs is designed with a scan_enable AND gate 1404 put into each N balanced limbs or sections 1402. Each limb 1402 is then used to drive the logic in a single scan chain.

As indicated in a block 1508, the logic is designed. This logic design step at block 1508 can be done in parallel with, or even before clock control tree with N balanced limbs is designed at block 1506. During the design of the logic, the latch thold and scan connections can be ignored. When the logic is designed, the latches in the logic are grouped into N groups of equal or nearly equal size as indicated in a block 1510. This grouping of latches in the logic into N groups should be based on physical proximity. Each group of latches will belong in a single scan chain as indicated at block 1510. There are different algorithms that could be used for grouping the latches. However, it is sufficient to require that the grouping of the latches into N groups of approximately equal size.

Next the latches belonging to a particular scan chain are then connected to the corresponding limb 1402 of the thold tree 1400 as indicated in a block 1512. Every latch in a single scan chain must be driven by a leaf-node 1406 that is driven by that correct limb 1402 of the tree. For example, all of the latches in scan chain 0 must be driven by leaf-nodes 1406 that are driven by limb 0 of the thold tree 1400. The method typically calls for connecting each latch to the closest leaf-node 1406 of the correct limb 1402 with some exceptions being made to balance the loading of the leaf nodes. Even when a latch is not connected to the closest leaf node 1406, the latch still must be connected to a leaf node that belongs to the correct limb of the thold tree.

As indicated in a block 1514, a separate scan chain is built for the latches in each group. The scan chain for a group would chain together every latch in a particular group, and no latches from other groups. This step could be done before connecting the latches to the correct clock tree limb 1402 at block 1512.

An exemplary process that could be used to group the latches into N groups based on physical proximity at block 1510 includes of the following steps:

(1) Randomly assign every cell in the partition, which contains scannable latches into one of N scan chains such that each chain has the same (T/N) or nearly the same number of latches.

(2) Choose a physical "centroid" location for each of the N scan chains. This could be done before step 1 and is not dependent on step 1.

(3) Swap cells between scan chains in order to minimize the distance between each cell and the centroid of its assigned scan chain. This swapping can be done by swapping cells between two chains or by making more complicated trades between several chains. The swapping can also be done by swapping only blocks of equal latch-counts, or multiple, smaller cells may be swapped for one larger cell, and the like.

The main point is that the above Step 1 balances the scan chains by randomly dividing the latches into the different scan chains. The swapping done in step 3 causes the latches to be grouped by proximity to the centroids, while keeping the chains balanced in size.

(4) Finally provision is made to make manual adjustments to the scan chain assignments, as deemed useful by the designer.

Figure 16:
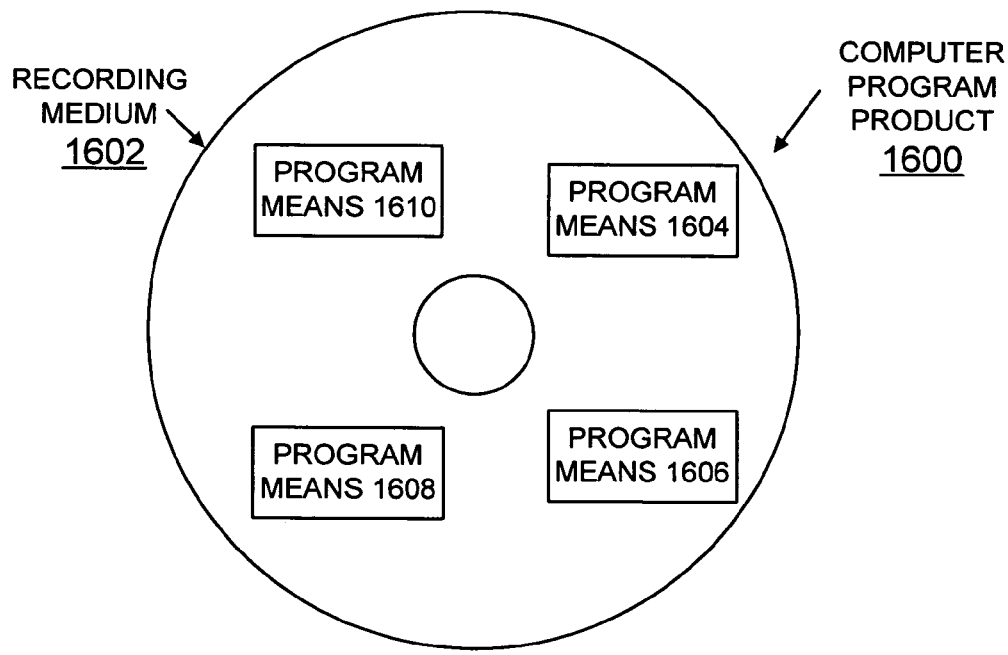
FIG. 16 is a block diagram illustrating a computer program product in accordance with the preferred embodiment.

Referring now to FIG. 16, an article of manufacture or a computer program product 1600 of the invention is illustrated. The computer program product 1600 includes a recording medium 1602, such as, a floppy disk, a high capacity read only memory in the form of an optically read compact disk or CD-ROM, a tape, a transmission type media such as a digital or analog communications link, or a similar computer program product. Recording medium 1602 stores program means 1604, 1606, 1608, 1610 on the medium 1602 for carrying out the methods for designing logic scan chains for matching gated portions of a clock tree of the preferred embodiment in the system 200 of FIGS. 2 and 3.

A sequence of program instructions or a logical assembly of one or more interrelated modules defined by the recorded program means 1604, 1606, 1608, 1610, direct the computer system 100 for implementing methods for designing logic scan chains for matching gated portions of a clock tree of the preferred embodiment.

While the present invention has been described with reference to the details of the embodiments of the invention shown in the drawing, these details are not intended to limit the scope of the invention as claimed in the appended claims.

What is claimed is:

1. A method for designing logic scan chains for matching gated portions of a clock tree comprising the steps of:
   identifying a total number T of scannable latches and a number N of scan chains;
   designing logic including said total number T of scannable latches; and grouping said total number T of scannable latches into N latch groups of substantially equal size,
   designating a respective one of said N latch groups to define each said respective scan chain of said plurality of scan chains including choosing a physical centroid location for each respective scan chain of said plurality of scan chains, and
   swapping cells between respective scan chains to minimize a distance between each cell and said physical centroid location of an assigned scan chain for each cell causing said scannable latches to be grouped by proximity to said physical centroid location of said assigned scan chain;
   designing a clock tree including designing a plurality of N balanced sections, each said section including a gate receiving inputs of a global clock and a respective chain-specific clock control signal for a particular scan chain;
   connecting a plurality of latches to a corresponding chain-specific clock tree section to define each respective scan chain of a plurality of scan chains; and
   building a scan chain for each of said plurality of latches defining said respective scan chain.

2. A method for designing logic scan chains as recited in claim 1 wherein the steps of designing said clock tree including designing said plurality of N balanced sections and designing logic includes creating an initial scan chain for each said section of said clock tree.

3. A method for designing logic scan chains as recited in claim 2 wherein the step of connecting said plurality of latches to said corresponding chain-specific clock tree section includes the steps of connecting each latch in the logic to a selected leaf node of the clock tree, wherein said selected leaf node includes a closest leaf node of the clock tree to each said latch in the logic.

4. A method for designing logic scan chains as recited in claim 3 wherein the step of building said scan chain for each of said plurality of latches defining said respective scan chain includes the steps of connecting in serial order each said latch connected to each said selected leaf node of said clock tree.

5. A method for designing logic scan chains as recited in claim 4 includes the steps of connecting together each of said serial-order connected latches to complete said scan chain.

6. A method for designing logic scan chains as recited in claim 1 wherein the step of connecting said plurality of latches for defining said respective scan chain of a plurality of scan chains to a corresponding chain-specific clock tree section includes the steps of connecting each latch of each respective latch group to a respective corresponding balanced section of the clock tree.

7. A method for designing logic scan chains as recited in claim 1 wherein the step of building said scan chain for each of said plurality of latches defining said respective scan chain includes the steps of chaining together each said latch in each said respective latch group.

8. A method for designing logic scan chains as recited in claim 1 includes the step of selecting latches to be connected manually.

9. A computer program product embedded in a computer readable storage medium for designing logic scan chains for matching gated portions of a clock tree in a computer system, said computer program product including instructions executed by the computer system to cause the computer system to perform the steps of:

identifying a total number T of scannable latches and a number N of scan chains;

designing logic including said total number T of scannable latches; and grouping said total number T of scannable latches into N latch groups of substantially equal size, designing a respective one of said N latch groups to define each said respective scan chain of said plurality of scan chains including choosing a physical centroid location for each respective scan chain of said plurality of scan chains, and swapping cells between respective scan chains to minimize a distance between each cell and said physical centroid location of an assigned scan chain for each cell causing said scannable latches to be grouped by proximity to said physical centroid location of said assigned scan chain;

designing a clock tree including designing a plurality of N balanced sections, each said section including a gate receiving inputs of a global clock and a respective chain-specific clock control signal for a particular scan chain;

connecting a plurality of latches to a corresponding chain-specific clock tree section to define each respective scan chain of a plurality of scan chains; and building a scan chain for each of said plurality of latches defining said respective scan chain.

10. A computer program product for designing logic scan chains for matching gated portions of a clock tree as recited in claim 9 wherein the step of connecting said plurality of latches to said corresponding chain-specific clock tree section includes the steps of connecting each latch of each respective latch group to a respective corresponding balanced section of the clock tree.

11. A computer program product for designing logic scan chains for matching gated portions of a clock tree as recited in claim 9 wherein the step of connecting said plurality of latches to said corresponding chain-specific clock tree section and designing logic including said plurality of said total number T of scannable latches; includes connecting each latch in the logic to a selected leaf node of the clock tree, wherein said selected leaf node includes a closest leaf node of the clock tree to each said latch in the logic.

12. A computer program product for designing logic scan chains for matching gated portions of a clock tree as recited in claim 11 wherein the step of building said scan chain for each of said plurality of latches defining said respective scan chain includes the steps of connecting in serial order each said latch connected to each said selected leaf node of said clock tree.

13. Apparatus for designing logic scan chains for matching gated portions of a clock tree comprising:

an electronic design program including a logic scan chain design program;

said logic scan chain design program identifying a total number T of scannable latches and a number N of scan chains;

said logic scan chain design program designing logic including said total number T of scannable latches; and grouping said total number T of scannable latches into N latch groups of substantially equal size, said logic scan chain design program designing a respective one of said N latch groups to define each said respective scan chain of said plurality of scan chains including choosing a physical centroid location for each respective scan chain of said plurality of scan chains, and said logic scan chain design program swapping cells between respective scan chains to minimize a distance between each cell and said physical centroid location of an assigned scan chain for each cell causing said scannable latches to be grouped by proximity to said physical centroid location of said assigned scan chain;

said logic scan chain design program designing a clock tree including a plurality of sections, each said section including a gate receiving inputs of a global clock and a respective chain-specific clock control signal for a particular scan chain;

said logic scan chain design program for connecting a plurality of said scannable latches to a corresponding chain-specific clock tree section to define each respective scan chain of a plurality of scan chains; and said logic scan chain design program building a scan chain for each of said plurality of said scannable latches defining said respective scan chain.

14. Apparatus for designing logic scan chains for matching gated portions of a clock tree as recited in claim 13 wherein said logic scan chain design program connects each said scannable latch to a selected leaf node of the clock tree, wherein said selected leaf node includes a closest leaf node of the clock tree to each said scannable latch; and connects in serial order each said latch connected to each said selected leaf node of said clock tree.

* * * * *